United States Patent
Chung

(10) Patent No.: US 9,368,456 B2
(45) Date of Patent: Jun. 14, 2016

(54) SEMICONDUCTOR PACKAGE HAVING EMI SHIELDING AND METHOD OF FABRICATING THE SAME

(71) Applicant: SK HYNIX INC., Icheon (KR)

(72) Inventor: Qwan Ho Chung, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/290,572

(22) Filed: May 29, 2014

(65) Prior Publication Data

US 2015/0187705 A1    Jul. 2, 2015

(30) Foreign Application Priority Data

Dec. 31, 2013    (KR) .................. 10-2013-0168673

(51) Int. Cl.
| | |
|---|---|
| *H01L 23/552* | (2006.01) |
| *H01L 23/50* | (2006.01) |
| *H01L 21/56* | (2006.01) |
| *H01L 21/768* | (2006.01) |
| *H01L 23/31* | (2006.01) |
| *H01L 23/00* | (2006.01) |

(52) U.S. Cl.
CPC .............. *H01L 23/552* (2013.01); *H01L 21/56* (2013.01); *H01L 21/76802* (2013.01); *H01L 23/3135* (2013.01); *H01L 23/3164* (2013.01); *H01L 23/50* (2013.01); *H01L 24/97* (2013.01); *H01L 2224/05554* (2013.01); *H01L 2224/32145* (2013.01); *H01L 2224/48147* (2013.01); *H01L 2224/49175* (2013.01); *H01L 2224/73265* (2013.01); *H01L 2225/06562* (2013.01); *H01L 2924/12042* (2013.01)

(58) Field of Classification Search
None
See application file for complete search history.

(56) References Cited

U.S. PATENT DOCUMENTS

| | | | | |
|---|---|---|---|---|
| 8,084,300 | B1 * | 12/2011 | San Antonio et al. | ........ 438/114 |
| 8,138,024 | B2 | 3/2012 | Do et al. | |
| 8,232,631 | B2 | 7/2012 | Cho | |
| 2011/0298101 | A1 * | 12/2011 | Pagaila et al. | .................. 257/659 |
| 2013/0223041 | A1 * | 8/2013 | Arnold et al. | .................. 361/818 |
| 2013/0292808 | A1 * | 11/2013 | Yen et al. | ....................... 257/660 |
| 2014/0048913 | A1 * | 2/2014 | Park et al. | ..................... 257/659 |
| 2014/0231973 | A1 * | 8/2014 | Huang et al. | .................. 257/659 |

* cited by examiner

Primary Examiner — Daniel Luke

(57) ABSTRACT

A semiconductor package includes a dielectric layer in which a chip is embedded, interconnection parts disposed on a first surface of the dielectric layer, through connectors each of which penetrates a portion of the dielectric layer over the chip to electrically couple the chip to a corresponding one of the interconnection parts, a shielding plate covering a second surface of the dielectric layer that is opposite to the first surface, and a shielding encapsulation part connected to one of the interconnection parts and covering sidewalls of the dielectric layer. The shielding encapsulation part includes a portion contacting the shielding plate.

12 Claims, 14 Drawing Sheets ing the shielding plate. The shielding encapsulation part is formed to be connected to one of the interconnection parts.

According to further embodiments, a memory card includes a memory and a memory controller suitable for controlling an operation of the memory. The memory includes a dielectric layer in which a chip is embedded, circuit interconnection part disposed on a first surface of the dielectric layer, through connection part penetrating the dielectric layer to electrically connect the chip to the circuit interconnection part, a shielding plate covering a second surface of the dielectric layer opposite to the first surface, and a shielding encapsulation part extending from any one of the circuit interconnection part to cover sidewalls of the dielectric layer. The shielding encapsulation part is combined with the shielding plate.

According to further embodiments, an electronic system includes a memory and a controller coupled with the memory through a bus. The memory or the controller includes a dielectric layer in which a chip is embedded, circuit interconnection part disposed on a first surface of the dielectric layer, through connection part penetrating the dielectric layer to electrically connect the chip to the circuit interconnection part, a shielding plate covering a second surface of the dielectric layer opposite to the first surface, and a shielding encapsulation part extending from any one of the circuit interconnection part to cover sidewalls of the dielectric layer. The shielding encapsulation part is combined with the shielding plate.

SEMICONDUCTOR PACKAGE HAVING EMI SHIELDING AND METHOD OF FABRICATING THE SAME

CROSS-REFERENCE TO RELATED APPLICATION

The present application claims priority under 35 U.S.C 119(a) to Korean Patent Application No. 10-2013-0168673, filed on Dec. 31, 2013, in the Korean Intellectual Property Office, which is incorporated herein by reference in its entirety as set forth in full.

BACKGROUND

1. Technical Field

Embodiments of the present disclosure relate to a semiconductor package and, more particularly, to a semiconductor package having EMI shielding and a method of fabricating the same.

2. Related Art

When semiconductor chips or dies operate, electromagnetic waves and/or high frequency noises may be generated. The electromagnetic waves and/or high frequency noises may affect systems that are external to the semiconductor device including the chips or dies, such as human bodies, other semiconductor chips, and/or other electronic systems. Recently, shielding these systems from electromagnetic interference (EMI) has become more important in wearable devices and mobile devices that are used closer to a human body.

SUMMARY

Various embodiments are directed to a semiconductor package having EMI shielding and a method of fabricating the same.

According to embodiments, a semiconductor package includes a chip embedded in a dielectric layer, interconnection parts disposed on a first surface of the dielectric layer, through connectors each of which penetrates a portion of the dielectric layer over the chip, each of the through connectors electrically coupling the chip to one of the interconnection parts, a shielding plate covering a second surface of the dielectric layer that is opposite to the first surface, and a shielding encapsulation part connected to one of the interconnection parts, covering sidewalls of the dielectric layer, and including a portion that contacts the shielding plate.

According to further embodiments, a method of fabricating a semiconductor package includes forming a dielectric layer having a chip embedded therein over a shielding plate, forming a conductive layer covering a surface of the dielectric layer and an exposed portion of the shielding plate, and patterning the conductive layer to form interconnection parts to be electrically coupled to the chip and a shielding encapsulation part, the shielding encapsulation part including a portion contacting the shielding plate. The shielding encapsulation part is connected to one of the interconnection parts.

According to further embodiments, a method of fabricating a semiconductor package includes providing a shielding plate, forming a first dielectric layer over the shielding plate, mounting at least one chip on the first dielectric layer, forming a second dielectric layer to cover the chip, forming a conductive layer to cover the second dielectric layer in which the chip is embedded, and patterning the conductive layer to form interconnection parts electrically coupled to the chip and a shielding encapsulation part that includes a portion contact-

BRIEF DESCRIPTION OF THE DRAWINGS

Embodiments of the present disclosure will become more apparent in view of the attached drawings and accompanying detailed description, in which.

DESCRIPTION OF EMBODIMENTS

It will be understood that although the terms "first," "second," "third," etc. may be used herein to describe various elements, these elements should not be limited by these terms. These terms are only used to distinguish one element from other elements. Thus, a first element in some embodiments could be termed a second element in other embodiments.

It will also be understood that when an element is referred to as being "on," "above," "below," or "under" another element, it can be directly "on," "above," "below," or "under" the other element, respectively, or at least one intervening element may be present therebetween. Accordingly, the terms such as "on," "above," "below," or "under" which are used herein are for the purpose of describing particular embodiments only and are not intended to limit the inventive concept.

It will be further understood that when an element is referred to as being "connected" or "coupled" to another element, it can be directly connected or coupled to the other element or at least one intervening element may be present therebetween. In contrast, when an element is referred to as being "directly connected" or "directly coupled" to another element, there are no intervening elements present therebetween. Other words used to describe the relationship between elements or layers should be interpreted in a like fashion. Semiconductor chips may be obtained by dividing a semiconductor substrate such as a wafer into a plurality of pieces through a die sawing process.

Semiconductor chips may be memory chips or logic chips. Memory chips may include dynamic random access memory (DRAM) circuits, static random access memory (SRAM) circuits, flash memory circuits, magnetic random access memory (MRAM) circuits, resistive random access memory (ReRAM) circuits, ferroelectric random access memory (FeRAM) circuits, phase change random access memory (PcRAM) circuits, and so on, which are integrated on and/or in a semiconductor substrate. Logic chips may include logic circuits which are integrated on and/or in a semiconductor substrate. In some cases, the term "semiconductor substrate" used herein may be construed as a semiconductor chip or a semiconductor die in which integrated circuits are formed.

Figure 1:
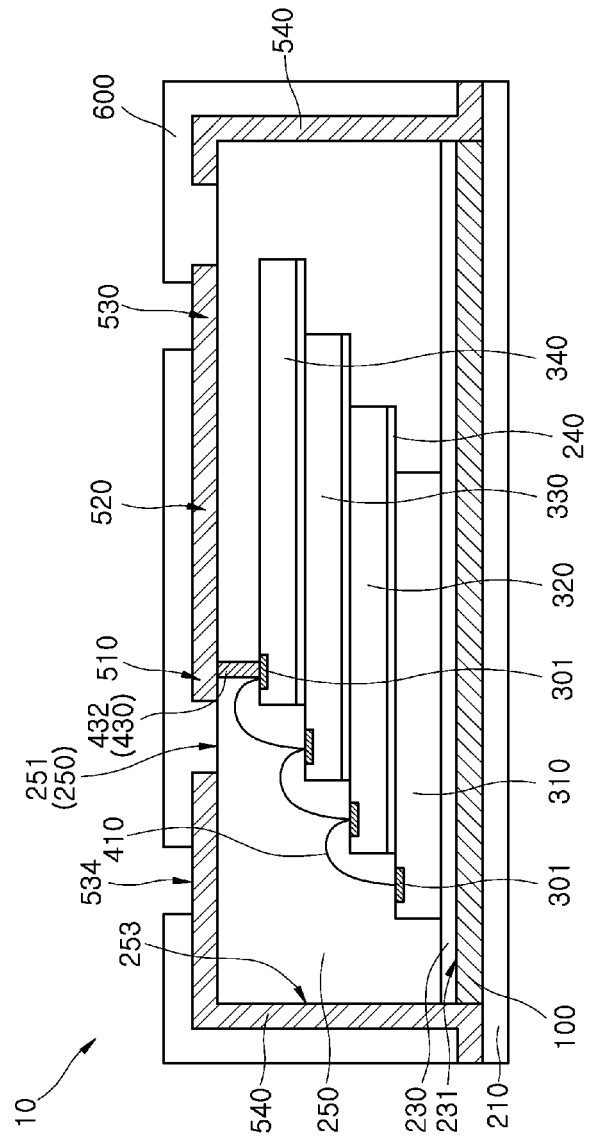
FIG. 1 is a cross-sectional view illustrating a semiconductor package according to an embodiment of the present disclosure.
Figure 2:
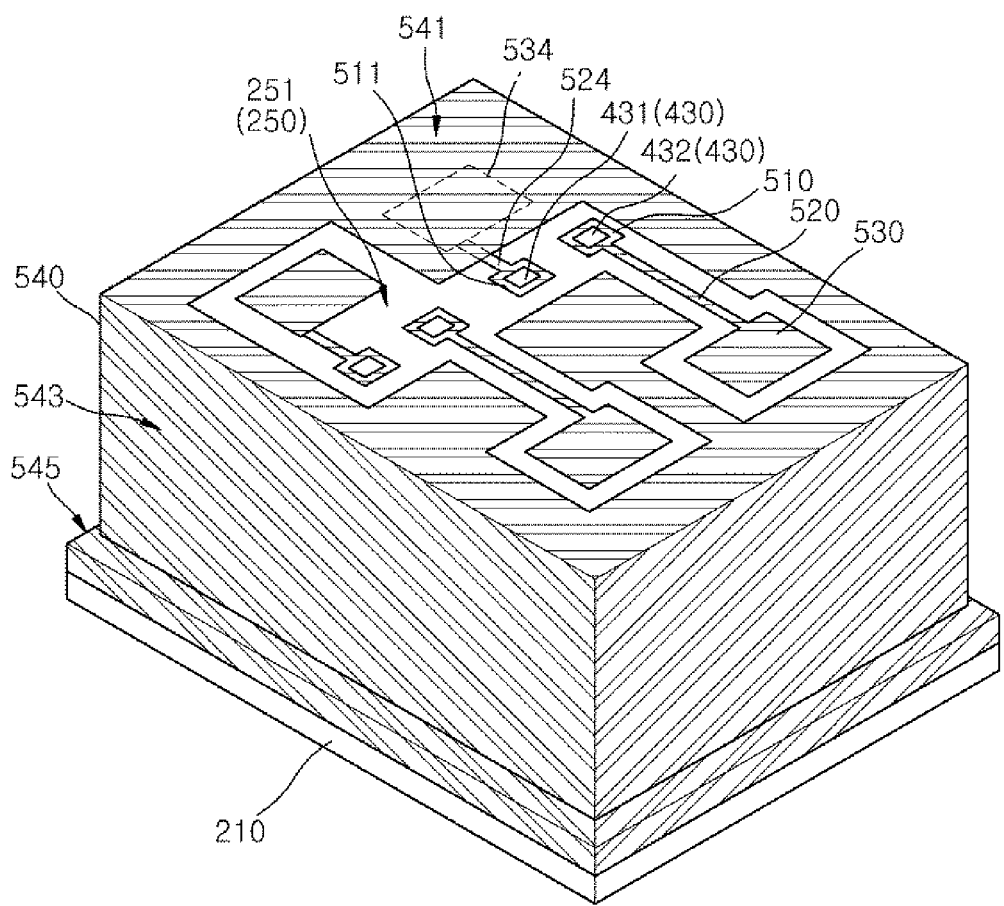
FIG. 2 is a perspective view illustrating the semiconductor package of FIG. 1.

FIGS. 1 and 2 illustrate a semiconductor package according to an embodiment of the present disclosure. The semiconductor package 10 includes a shielding plate 100, a plurality of semiconductor chips, e.g., chips 310, 320, 330, and 340 (310 to 340), stacked on the shielding plate 100, and one or more dielectric layers (e.g., a first dielectric layer 230 and a second dielectric layer 250), which together form a dielectric layer 230+250 that surrounds the semiconductor chips 310 to 340. In an embodiment, there are two dielectric layers 230 and 250 that are bonded together to form the dielectric layer 230+250 that surrounds the semiconductor chips 310 to 340. In addition, the semiconductor package 10 includes a circuit interconnection part 510+520+530, which includes one or more portions, and a shielding encapsulation part 540.

The circuit interconnection part 510+520+530 and the shielding encapsulation part 540 are disposed on surfaces of the dielectric layers 230 and 250. The semiconductor chips 310 to 340 in which circuits are integrated are embedded in the dielectric layer 230+250, and the circuit interconnection part 510+520+530 is disposed on a first surface 251 of the dielectric layer 230+250. The circuit interconnection part electrically couples the semiconductor package 10 to an external device (not shown) or a module substrate (not shown). Thus, the semiconductor package 10 has an embedded package structure.

Figure 3:
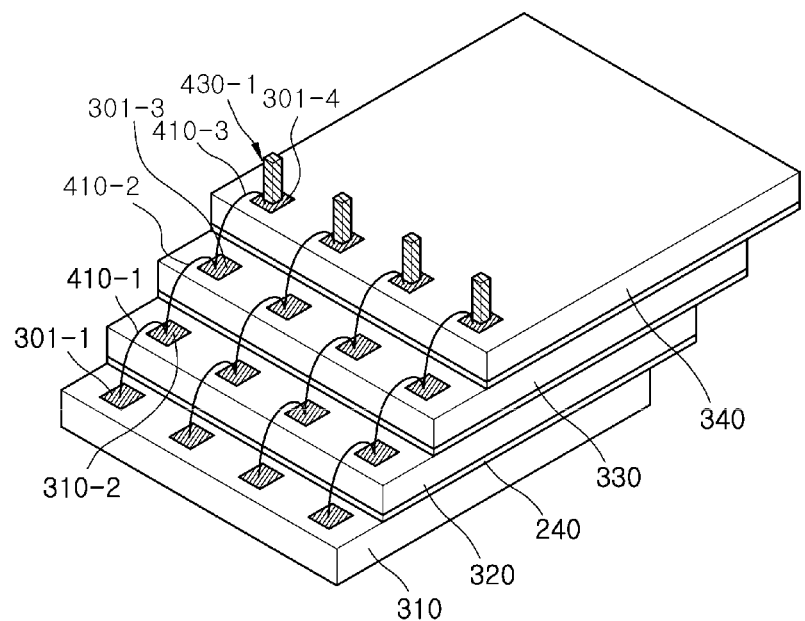
FIG. 3 is a perspective view illustrating stacked chips included in the semiconductor package of FIG. 1.

FIG. 3 is a perspective view illustrating stacked semiconductor chips included in the semiconductor package 10 of FIG. 1. Referring to FIGS. 1 and 3, the semiconductor package 10 includes the first chip 340 that is nearest to the first surface 251 of the dielectric layer 230+250. Further, the second to fourth chips 330, 320, and 310 are disposed below the first chip 340. The fourth, third, second and first chips 310, 320, 330 and 340 may be sequentially stacked on the shielding plate 100. The fourth, third, second and first chips 310, 320, 330 and 340 may be attached to each other using an adhesive layer 240 disposed therebetween. The fourth, third, second and first chips 310, 320, 330 and 340 may be stacked so that they are laterally offset, forming a step structure.

The chips 310 to 340 may be electrically coupled to each other by inter-chip connectors 410, such as bonding wires. For example, each of the chips 310 to 340 may include a plurality of chip pads 301, and corresponding chip pads 301 of each of the chips 310 to 340 may be electrically coupled to each other by the inter-chip connectors 410. The plurality of chip pads 301 of each of the chips 310 to 340 may be disposed on an edge of the chip. As a result, the chip pads 301 may be exposed when the chips 310 to 340 are stacked to be laterally offset, as illustrated in FIG. 3. The chip pads 301 of the chips 310 to 340 can be electrically coupled to each other using a bonding wire technique. When the chips 310 to 340 correspond to NAND-type flash memory devices, a large amount of data may be stored in the semiconductor package 10, and the inter-chip connectors 410 may act as electrical signal paths between the chips 310 to 340.

In some embodiments, the semiconductor chips 310 to 340 may be stacked to be vertically aligned with each other. In such a case, each of the semiconductor chips 310 to 340 may include through electrodes (not shown) vertically penetrating a body thereof, and the semiconductor chips 310 to 340 may be electrically coupled to each other by the through electrodes acting as electrical signal paths.

In an embodiment, the first dielectric layer 230 is disposed to cover the top surface of the shielding plate 100. The fourth chip 310 is attached to a top surface of the first dielectric layer 230 using an adhesive layer. The second dielectric layer 250 is disposed to substantially cover the semiconductor chips 310 to 340. Thus, the second dielectric layer 250 may be a core layer which is employed in embedded packages or embedded substrates. The second dielectric layer 250 is formed on the first dielectric layer 230 using a lamination technique.

As described above, the circuit interconnection part 510+ 520+530 disposed on the first surface 251 of the dielectric layer 230+250 may electrically couple the semiconductor package 10 to an external device (not shown) or a module substrate (not shown). The first surface 251 of the dielectric layer 230+250 may correspond to a bottom surface or a top surface of the semiconductor package 10. A surface of the first dielectric layer 230 that is on the opposite side of the semiconductor chips 310 to 340 from the first surface 251 is a second surface 231 of the dielectric layer 230+250. The shielding plate 100 is disposed below the second surface 231 of the dielectric layer 230+250. In an embodiment, the shielding plate 100 is in contact with the second surface 231 of the dielectric layer 230+250. The semiconductor package 10 may further include a third dielectric layer 210 that covers a surface of the shielding plate 100 opposite to the dielectric layer 230+250. The third dielectric layer 210 may be provided to prevent the shielding plate 100, which is formed of a conductive material such as copper, from being oxidized or contaminated.

Referring again to FIGS. 1 and 2, the semiconductor package 10 further includes a ground interconnection part 511+ 524+534 for transmitting a ground voltage to the semiconductor package 10. Interconnection parts other than the ground interconnection part 511+524+534 may be used as a signal interconnection part for transmitting and receiving data or a power interconnection part for supplying a power voltage to the semiconductor package 10.

The circuit interconnection part 510+520+530 includes a first contact portion 510 electrically coupled to the uppermost semiconductor chip, i.e., the first chip 340, a second contact portion 530 acting as an external connection terminal electrically coupled to an external device or a module substrate, and a connection portion 520 for electrically coupling the first contact portion 510 to the second contact portion 530. Similarly, the ground interconnection part 511+524+534 may include a first ground contact portion 511 electrically coupled to the first chip 340, a second ground contact portion 534 acting as an external connection terminal electrically coupled to an external device or a module substrate, and a ground connection portion 524 for electrically coupling the first ground contact portion 511 to the second ground contact portion 534. In an embodiment, a portion of the ground interconnection part 511+524+534 belongs to the encapsulation part 540.

The semiconductor package 10 further includes through connection parts 430 that electrically couple the first contact portion 510 and the first ground portion 511 to the semiconductor chip 340. The through connection parts 430 may include a first ground through connection portion 431 coupled to the first ground contact portion 511 and a second through connection part 432 coupled to the first contact portion 510 other than the first ground contact portion 511.

Referring again to FIG. 1, the through connection parts 430 may include bumps which are disposed on respective chip pads 301 of the first chip 340 nearest to the first surface 251 of the dielectric layer 230+250. In an embodiment, a bump of the through connection part 430 may extend perpendicularly from a surface of a chip pad 301. The bumps of the through connection part 430 may penetrate the second dielectric layer 250. The through connection part 430 may not be limited to the bumps. That is, any connectors that penetrate the second dielectric layer 250 to electrically couple the chip pads 301 of the first chip 340 to the first contact portion 510 or 511 can be used as a through connection part 430. In another embodiment, the through connection part 430 includes any of conductive wires, pillars, studs, and so on. The through connection part 430 may be electrically coupled to the inter-chip connectors 410 to form connection paths that electrically couple the semiconductor chips 310 to 340 to the circuit interconnection part 510+520+530.

Referring to FIG. 3, the chip pads 301-1 to 301-4 located at corresponding positions of the semiconductor chips 310 to 340, respectively, may be electrically coupled to the corresponding through connection part 430-1 via the inter-chip connectors 410-1 to 410-3. In an embodiment, although not shown in the drawings, a jump pad connected to the chip pad 301-4 may be disposed on the first chip 340, and the jump pad may be connected to the through connection part 430-1.

Referring again to FIGS. 1 and 2, the shielding encapsulation part 540 may extend from one of the interconnection parts, which include the circuit interconnection part 510+520+530 and the ground interconnection part 511+524+534, disposed on the first surface 251 of the dielectric layer 230+250. The shielding encapsulation part 540 may be disposed at substantially the same layer as the circuit interconnection part 510+520+530, and the shielding encapsulation part 540 and the circuit interconnection part 510+520+530 may be formed of a single conductive layer or a multi-layered conductive layer.

Referring to FIG. 2, the shielding encapsulation part 540 may include a first cover portion 541 covering a portion of the first surface 251 of the dielectric layer 230+250, a second cover portion 543 covering sidewalls 253 of the dielectric layer 230+250, and a joint portion 545, which adjoins the shielding plate 100.

The first cover portion 541 may be electrically coupled to the ground interconnection part 511+524+534. The first cover portion 541 may extend from the ground interconnection part 511+524+534 and be separated from the interconnection parts, e.g., the circuit interconnection part 510+520+530, other than the ground interconnection part 511+524+534. The first cover portion 541 may extend to cover portions of the first surface 251 that are not covered by the circuit interconnection part 510+520+530 and other circuit interconnection parts. In addition, the first cover portion 541 may extend to cover all edge portions of the first surface 251. As a result, only a portion of the first surface 251 is exposed. Exposed portions of the first surface 251 are provided between circuit interconnection parts, which are spaced apart by a predetermined distance for electrical insulation.

The second cover portion 543 of the shielding encapsulation part 540 may cover the entire surface of each of the sidewalls 253 of the dielectric layer 230+250. In some embodiments, the second cover portion 543 may expose a portion of at least one of the sidewalls 253 of the dielectric layer 230+250. However, if the second cover portion 543 covers the entire surface of each of the sidewalls 253 of the dielectric layer 230+250, an EMI shielding effect of the shielding encapsulation part 540 may be improved. The joint portion 545 of the shielding encapsulation part 540 may laterally and outwardly extend from the lower end of the second cover portion 543. The joint portion 545 may be disposed on the third dielectric layer 210 and may contact the top surfaces of edge portions of the third dielectric layer 210, as illustrated in FIG. 2. In such a case, the lower end of the second cover portion 543 may be adjoined with sidewalls of the shielding plate 100. Accordingly, the shielding plate 100 may be electrically coupled to the ground interconnection part 511+524+534 via the shielding encapsulation part 540.

Figure 4:
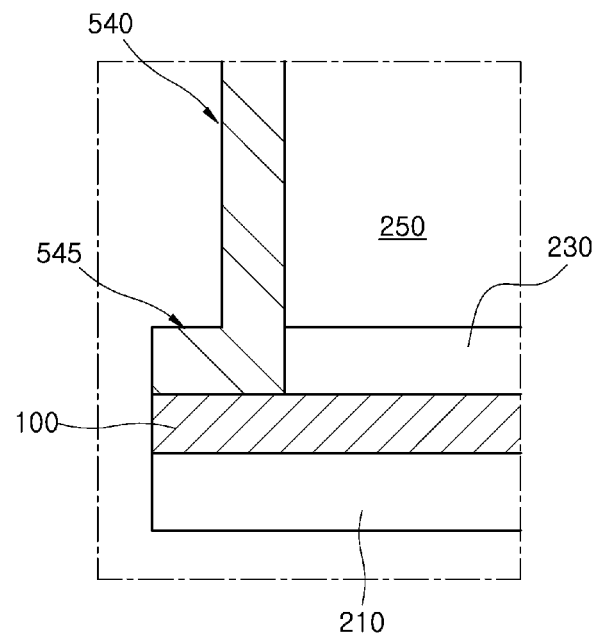
FIG. 4 is a cross-sectional view illustrating a portion of a shielding encapsulation part included in a semiconductor package according to another embodiment of the present disclosure.

FIG. 4 is a cross-sectional view illustrating a portion of a shielding encapsulation part included in a semiconductor package according to another embodiment of the present disclosure. Unlike the embodiment shown in FIGS. 1 and 2, in FIG. 4, the joint portion 545 of the shielding encapsulation part 540 contacts the top surfaces of edge portions of the shielding plate 100. That is, although the joint portion 545 may abut to the dielectric layer 230, the joint portion 545 is still in contact with the shielding plate 100. Accordingly, the shielding plate 100 may be still electrically coupled to the ground interconnection part 511+524+534 via the shielding encapsulation part 540.

The shielding plate 100 may act as a conductive blanket layer to cover the third dielectric layer 210. In an embodiment, as shown in FIG. 4, the shielding plate 100 fully covers the third dielectric layer 210. The shielding plate 100 may include a conductive material. In an embodiment, the shielding plate 100 may be a metal layer. In such a case, the metal layer may be formed using a plating process. In another embodiment, the shielding plate 100 is formed of a metal film such as a copper foil. In an embodiment, the shielding plate 100 covers the entire second surface 231 of the dielectric layer 230+250.

The semiconductor package 10 further includes a protection layer 600 covering the circuit interconnection part 510+520+530 and the shielding encapsulation part 540. The protection layer 600 may include a solder resist layer. The protection layer 600 has openings that expose the second contact portion 530 to which an external device or a module substrate is attached, and the second ground contact portion 534 to which a ground voltage signal is applied. In some embodiments, the first cover portion 541 may be partially exposed by an opening in the protection layer 600, and the exposed portion of the first cover portion 541 may be used as the second ground contact portion 534, as illustrated in FIG. 1.

Since the semiconductor package 10 includes the shielding encapsulation part 540 and the shielding plate 100, which are disposed on surfaces of the dielectric layer 230+250, it is possible to protect the semiconductor chips 310 to 340 embedded in the dielectric layer 230+250 from an outer EMI phenomenon. Also, it is possible to protect external systems (or human bodies) from an EMI which is generated from the embedded semiconductor chips 310 to 340.

FIGS. 5 to 14 are cross-sectional views illustrating a method of fabricating the semiconductor package 10 of FIG. 1 according to an embodiment of the present disclosure.

Figure 5:
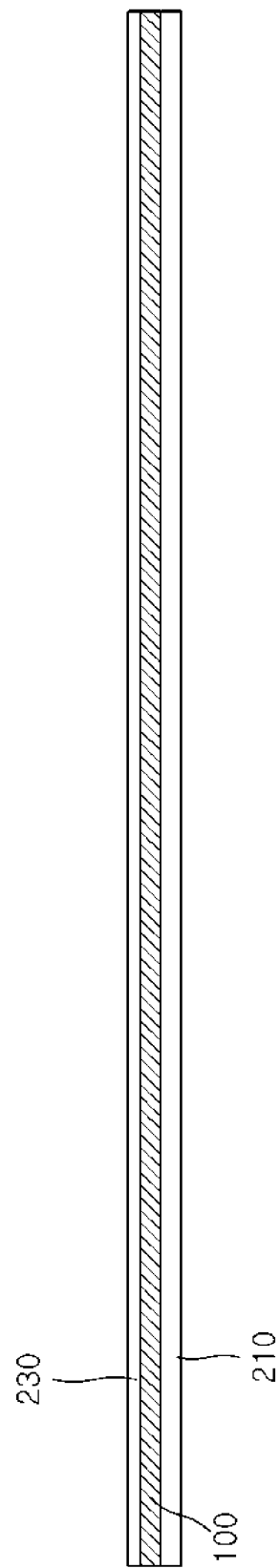
FIGS. 5 to 14 are cross-sectional views illustrating a method of fabricating the semiconductor package of FIG. 1 according to an embodiment of the present disclosure.

Referring to FIG. 5, a third dielectric layer 210 is provided. The third dielectric layer 210 may be used as an auxiliary substrate. In addition, the third dielectric layer 210 may act as an oxidation resistant layer or a contamination resistant layer. A shielding plate 100 is formed on the third dielectric layer 210. In an embodiment, the shielding plate 100 is formed of a conductive material. The shielding plate 100 may be formed of a metal layer such as a copper layer. The shielding plate 100 may be formed using a plating process. In another embodiment, the shielding plate 100 is formed by attaching a copper foil to the third dielectric layer 210. The shielding plate 100 may act as a conductive blanket layer that covers the entire top surface of the third dielectric layer 210.

Subsequently, a first dielectric layer 230 is formed on a side of the shielding plate 100 that is opposite to the third dielectric layer 210. In an embodiment, the first dielectric layer 230 is formed of a material having an adhesive strength, such that a semiconductor chip can be attached to the first dielectric layer 230 in a subsequent process. In another embodiment, an adhesive layer may be formed over the first dielectric layer 230. In some embodiments, instead of performing the above processes, a supporting substrate including a laminated layer of the first and third dielectric layers 230 and 210 and the shielding plate 100 embedded in the laminated layer can be provided.

Figure 6:
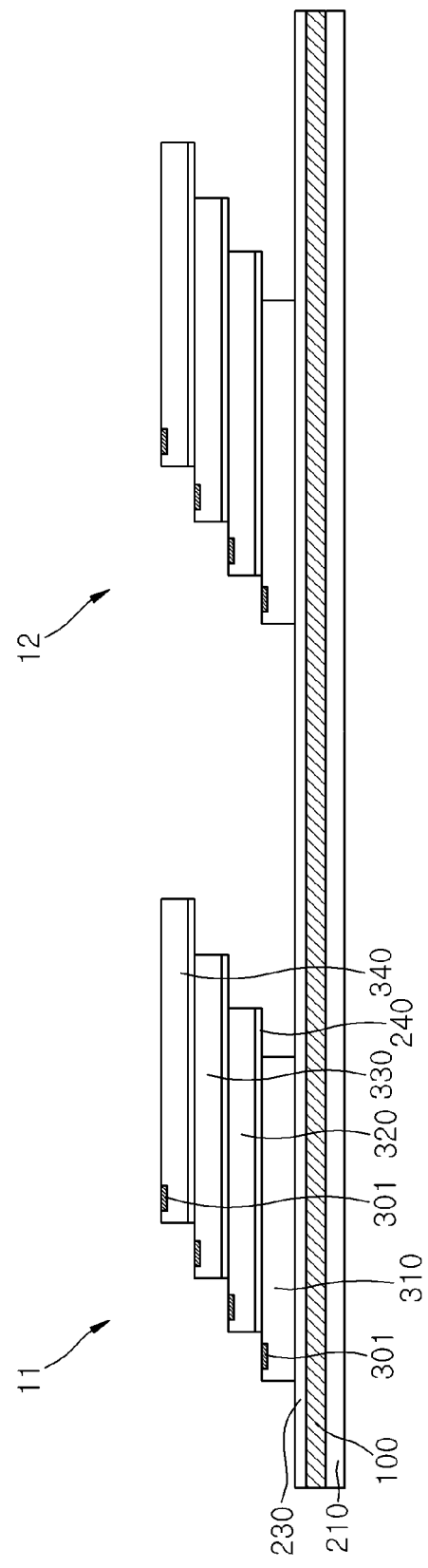

Referring to FIG. 6, a plurality of semiconductor chips may be mounted on the first dielectric layer 230. The plurality of semiconductor chips includes a first chip structure 11 and a second chip structure 12. The first and second chip structures 11 and 12 are each mounted on the first dielectric layer 230. That is, with respect to the orientation of the figure, the first and second chip structures neighbor each other horizontally, without any vertical overlap. The first chip structure 11 and the second chip structure 12 are separated from each other by a predetermined distance. Each of the first and second chip structures 11 and 12 may include a plurality of chips, e.g., chips 310 to 340. The chips 310 to 340 are stacked to be offset such that the plurality of stacked chips 310 to 340 has a step structure. The chips 310 to 340 are attached to each other using an adhesive layer 240. Because the stacked chips 310 to 340 are offset from each other, chip pads 301 formed on an edge portion of each of the chips 310 to 340 are exposed even after the plurality of chips 310 to 340 are vertically stacked.

Figure 7:
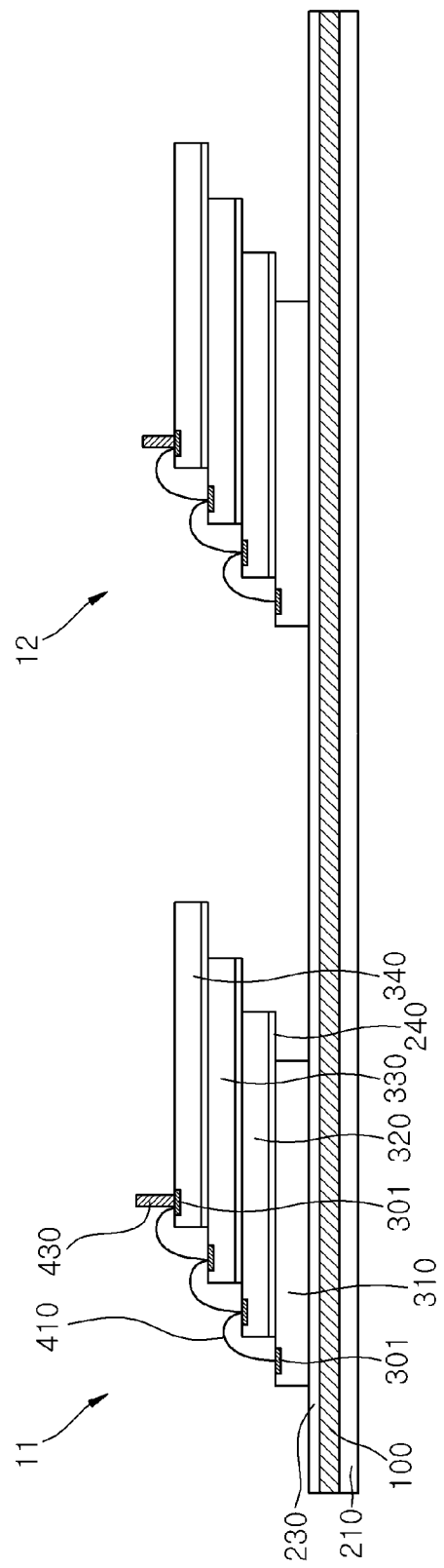

Referring to FIG. 7, inter-chip connectors 410 such as bonding wires are formed to electrically couple the chips 310 to 340 of each chip structure 11 or 12 to each other. In another embodiment, each of the chips 310 to 340 is formed to include through electrodes (not shown), such as through silicon vias (TSVs), which vertically penetrate a body of a corresponding chip. In such a case, the stacked chips 310 to 340 may be vertically aligned with each other, without any offset, and may be electrically coupled to each other via the through electrodes.

Through connection parts 430 are formed on respective chip pads 301 of the topmost chip (i.e., the first chip 340) of the chips 310 to 340. Thus, each of the through connection parts 430 may be electrically coupled to all of the chips 310 to 340 via the inter-chip connectors 410. The through connection parts 430 may be formed of bumps, and the bumps may be formed to be perpendicular to surfaces of the chip pads 301. The bumps may be formed of a metal, such as copper, or may be formed of a conductive paste material.

Figure 8:
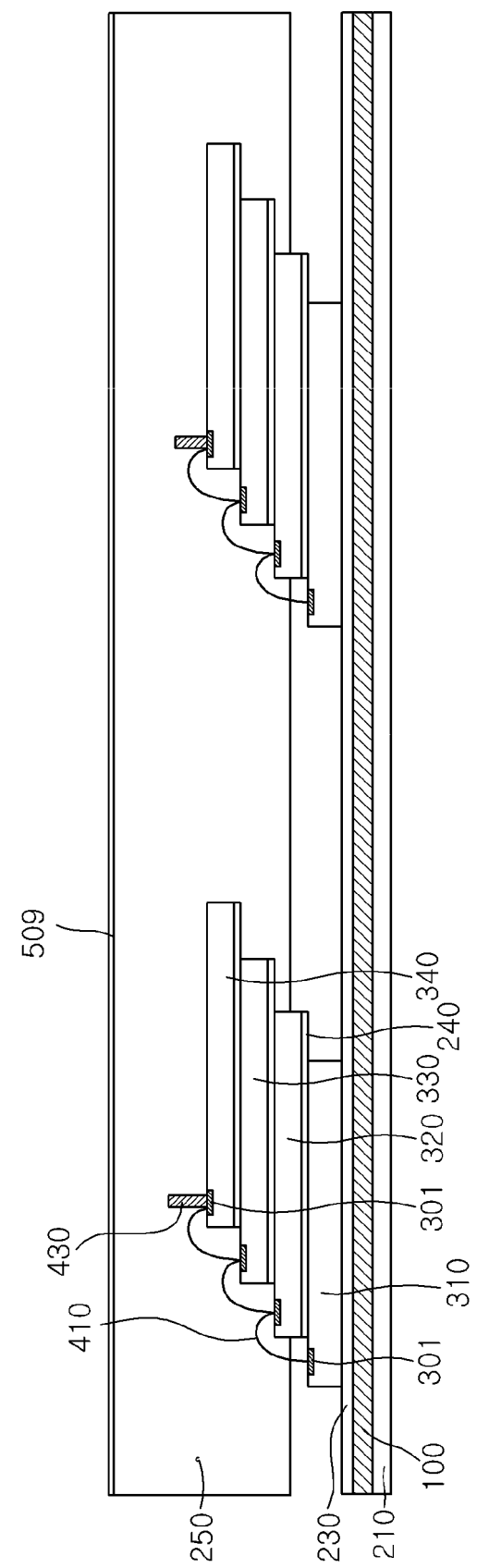

Referring to FIG. 8, a second dielectric layer 250 is formed on the first dielectric layer 230. The second dielectric layer 250 may be a core layer, and may be in the form of a sheet or a film. A metal layer 509 such as a copper layer is disposed on a top surface of the second dielectric layer 250. The metal layer 509 may be used as a seed layer for circuit interconnection parts, which are formed in a subsequent process. The first and second dielectric layers 230 and 250 may be laminated to embed the first and second chip structures 11 and 12 in the second dielectric layer 250. FIG. 8 shows the first and second dielectric layers 230 and 250 before a lamination process is complete. The second dielectric layer 250 may have cavities (not shown) therein such that the first and second chip structures 11 and 12 are more readily embedded in the second dielectric layer 250 when the first and second dielectric layers 230 and 250 are laminated. When the first and second dielectric layers 230 and 250 are laminated, the through connection parts 430 may penetrate into the second dielectric layer 250.

Figure 9:
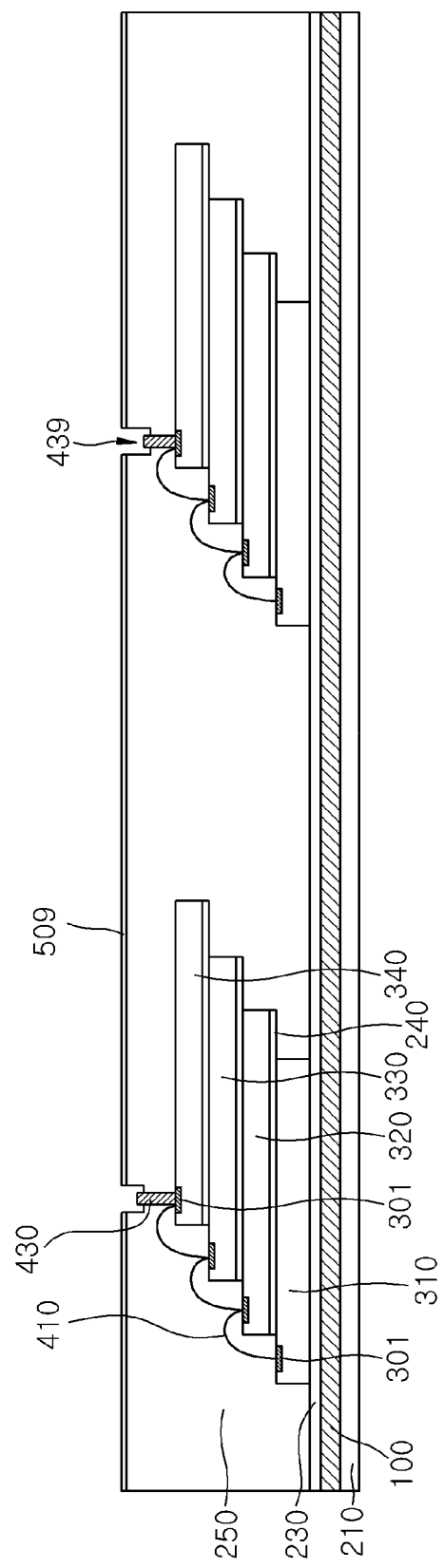

Referring to FIG. 9, portions of the second dielectric layer 250 and the seed layer 509 are selectively removed using a laser irradiation process or an etch process to form openings 439 that expose upper ends of the through connection parts 430.

Figure 10:
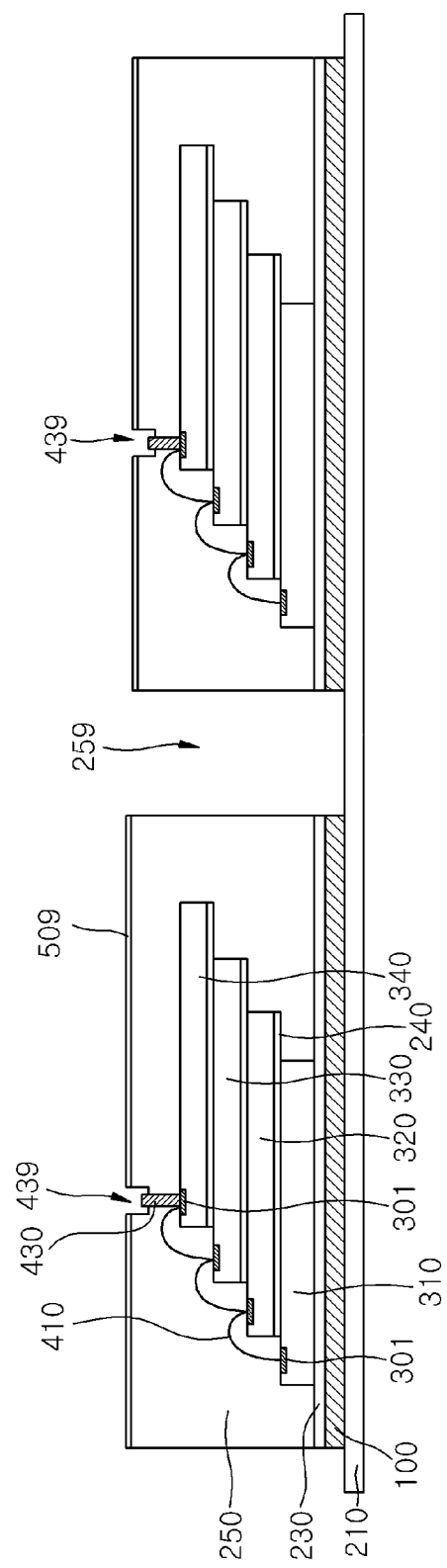

Referring to FIG. 10, the seed layer 509, the second dielectric layer 250, the first dielectric layer 230, and the shielding plate 100 are patterned to form a separation trench 259 positioned between the first and second chip structures 11 and 12. The separation trench 259 may be formed to expose a portion of the third dielectric layer 210. In such a case, the separation trench 259 may expose sidewalls of the shielding plate 100. The separation trench 259 may be formed using an etch process. As a result, the dielectric layer 230+250 is divided into two separate parts, and the first and second chip structures 11 and 12 are embedded in respective ones of the two separate parts of the dielectric layer 230+250. In some embodiments, the separation trench 259 may be formed in a sawing process using a sawing blade or a laser cutting process.

In some embodiments, as shown in FIG. 4, the separation trench 259 may be formed to expose a portion of the shielding plate 100. In such a case, the separation trench 259 may not expose the third dielectric layer 210.

Figure 11:
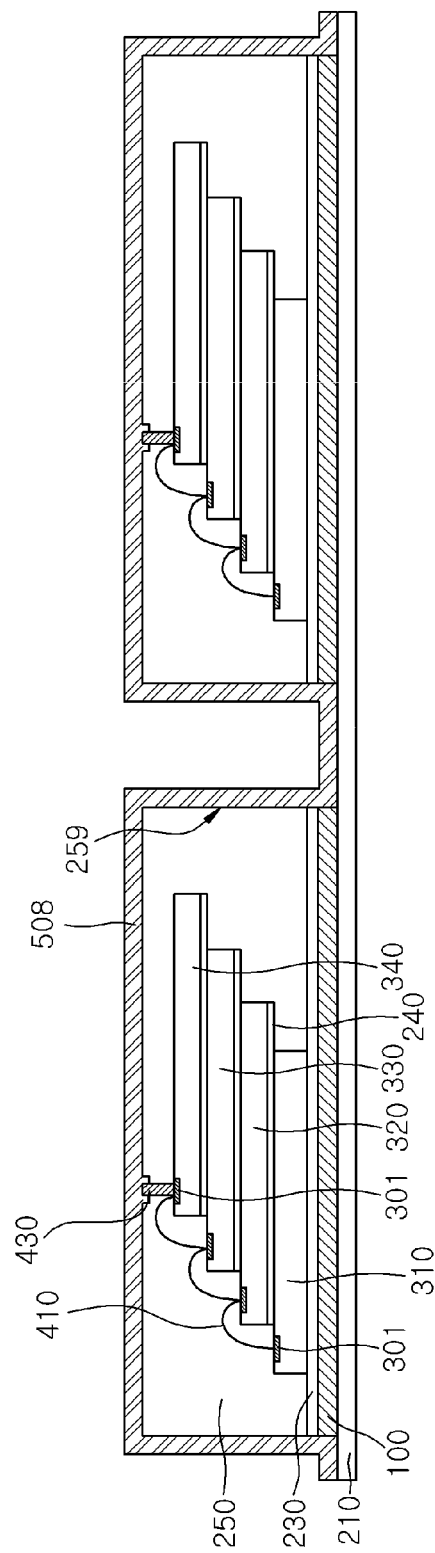

Referring to FIG. 11, a conductive layer 508 is formed on the two separate parts of the dielectric layer 230+250. In an embodiment, the conductive layer 508 may also be formed over surfaces of the trench 259. The conductive layer 508 may be formed to cover top surfaces and sidewalls of the two separate parts of the dielectric layer 230+250 and the exposed surface of the third dielectric layer 210. The conductive layer 508 may be formed using a plating process, for example, a copper plating process with the seed layer 509, or using a sputtering process.

Figure 12:
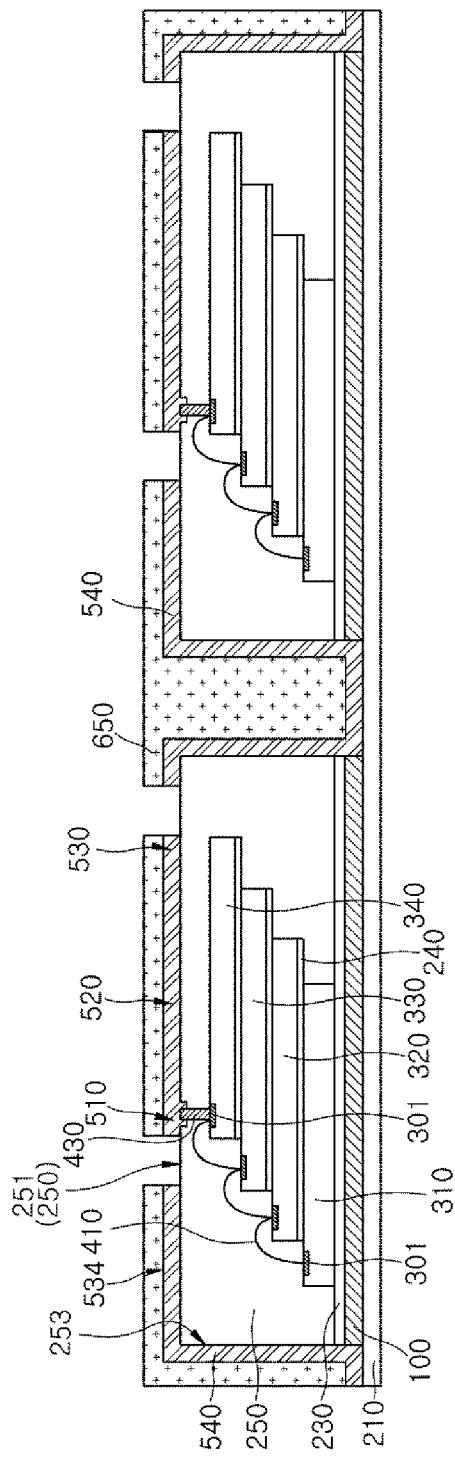

Referring to FIG. 12, the conductive layer 508 is patterned to from a ground interconnection part 511+524+534 (see FIG. 2), a circuit interconnection part 510+520+530 and a shielding encapsulation part 540. In an embodiment, a photoresist pattern 650 is formed on the conductive layer 508, and then the conductive layer 508 is etched using the photoresist pattern 650 as an etch mask to form the ground interconnection part 511+524+534, the circuit interconnection part 510+520+530 the shielding encapsulation part 540, wherein the circuit interconnection part 510+520+530 and the shielding encapsulation part 540 are separated from each other.

Figure 13:
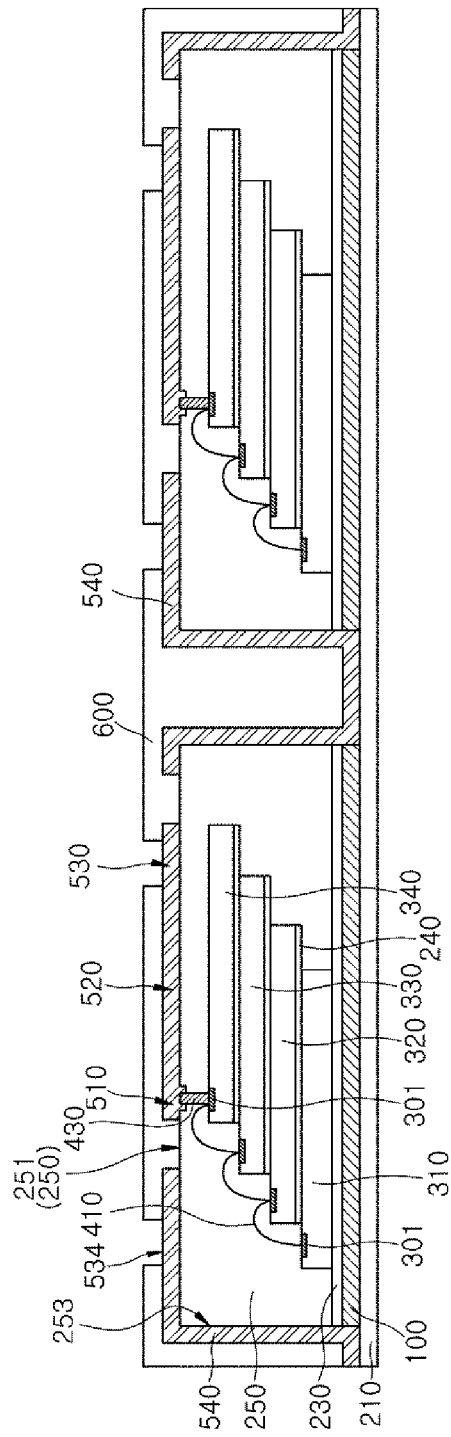

Referring to FIG. 13, the photoresist pattern 650 is removed. After that, a protection layer 600 is formed on the circuit interconnection part 510+520+530 and the shielding encapsulation part 540 to fill the separation trench 259. The protection layer 600 is then patterned to form openings that expose a second contact portion 530 of the circuit interconnection part 510+520+530 and a second ground contact portion 534 of a ground interconnection part 511+524+534 (see FIG. 2). The protection layer 600 may include a solder resist layer. The protection layer 600 may be formed to cover the shielding encapsulation part 540, which is formed on sidewalls and top surfaces of the two separate parts of the dielectric layer 230+250. Thus, the protection layer 600 may prevent the shielding encapsulation part 540 from being oxidized or contaminated.

Figure 14:
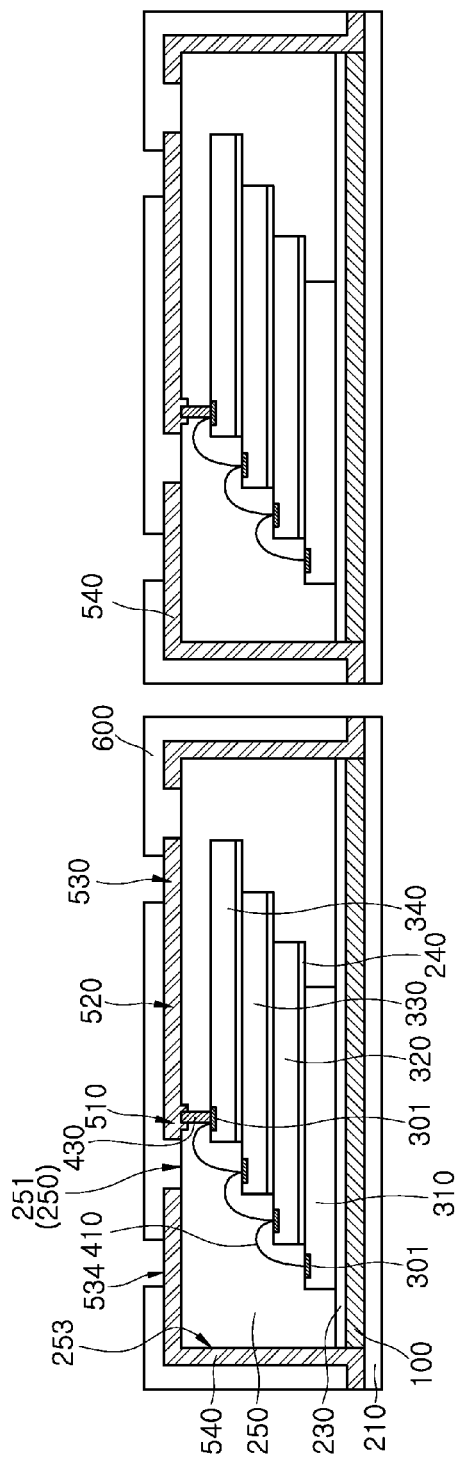

Referring to FIG. 14, the protection layer 600, the shielding encapsulation part 540 and the third dielectric layer 210 disposed between the first and second chip structures 11 and 12 are cut to physically separate the first and second chip structures 11 and 12 from each other, thus forming two semiconductor packages. The protection layer 600, the shielding encapsulation part 540 and the third dielectric layer 210 disposed between the first and second chip structures 11 and 12 may be cut in a sawing process using a sawing blade or a laser cutting process.

According to the above embodiments, the shielding encapsulation part 540 and the shielding plate 100 may be formed while embedded packages are fabricated. Thus, an EMI shielding structure may be formed without increase of a thickness of semiconductor packages. In addition, the shielding encapsulation part 540 and the circuit interconnection part 510+520+530 are simultaneously formed to reduce the number of fabrication process steps.

A semiconductor package in accordance with an embodiment described above may be applied to various electronic systems.

Figure 15:
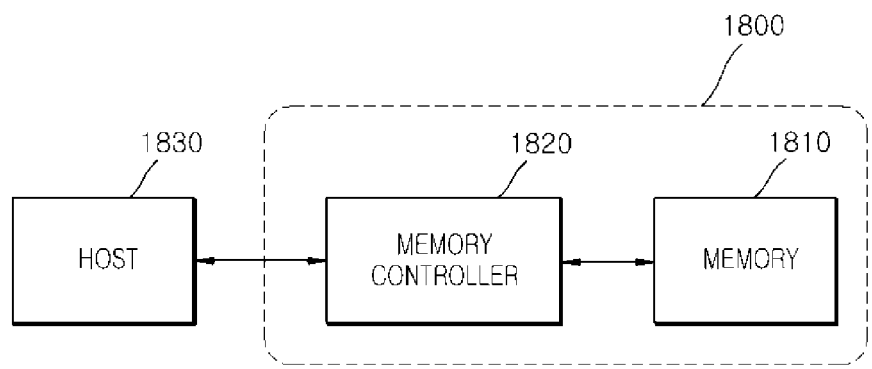
FIG. 15 illustrates an electronic system including a semiconductor package according to an embodiment of the present disclosure.

FIG. 15 illustrates an electronic system including a semiconductor package in accordance with an embodiment in the form of a memory card 1800. The memory card 1800 includes a memory 1810, such as a nonvolatile memory device, and a memory controller 1820. The memory 1810 and the memory controller 1820 may store data therein or read out data stored therein.

The memory 1810 may include at least one nonvolatile memory device to which packaging technologies in accordance with an embodiment of the present disclosure are applied. The memory controller 1820 may control the memory 1810 such that data stored in the memory 1810 is read out or data is stored in the memory 1810 in response to a read/write request from a host 1830.

Figure 16:
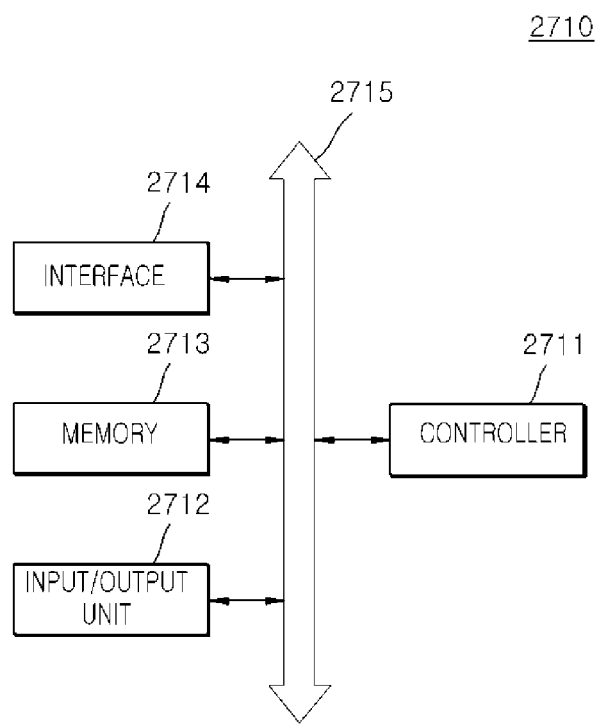
FIG. 16 illustrates another electronic system including a semiconductor package according to an embodiment of the present disclosure.

FIG. 16 illustrates an electronic system 2710 including a semiconductor package in accordance with an embodiment. The electronic system 2710 includes a controller 2711, an input/output unit 2712, and a memory 2713. The controller 2711, the input/output unit 2712, and the memory 2713 may be coupled with one another via a bus 2715, which provides a data transmission path between components.

The controller 2711 may include at least one of one or more microprocessors, one or more digital signal processors, one or more microcontrollers, one or more logic devices, and so on. The controller 2711 and/or the memory 2713 may include one or more semiconductor packages according to an embodiment of the present disclosure. The input/output unit 2712 may include any of a keypad, a keyboard, a display device, a touch screen and so forth. The memory 2713 may store data and/or commands to be executed by the controller 2711.

The memory 2713 may include a volatile memory device, such as DRAM, and/or a nonvolatile memory device, such as flash memory. For example, the flash memory may be mounted to an information processing system such as a mobile terminal or a desktop computer. The flash memory may constitute a solid state disk (SSD). Thus, the electronic system 2710 may store a large amount of data in a flash memory system.

The electronic system 2710 may further include an interface 2714 suitable for transmitting and receiving data to and from a communication network. The interface 2714 may be a wired or wireless interface, and include an antenna or a wired or wireless transceiver.

The electronic system 2710, therefore, may be a mobile system or device, a personal computer or laptop, an industrial computer or server, or any other logic or computing system. For example, the mobile system or device may be any one of a personal digital assistant (PDA), a portable computer, a tablet computer, a mobile phone, a smart phone, a wireless phone, a laptop computer, a memory card, a digital music system and an information transmission/reception system.

In some embodiments, the electronic system 2710 may be utilized by a communication system, such as a CDMA (code division multiple access), GSM (global system for mobile communications), NADC (North American digital cellular), E-TDMA (enhanced-time division multiple access), WCDMA (wideband code division multiple access), CDMA2000, LTE (long term evolution), and/or Wibro (wireless broadband Internet).

Embodiments have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor package, comprising:
a chip embedded in a dielectric layer;
interconnection parts disposed on a first surface of the dielectric layer;
through connectors each of which penetrates a portion of the dielectric layer over the chip, each of the through connectors electrically coupling the chip to one of the interconnection parts;
a shielding plate covering a second surface of the dielectric layer that is opposite to the first surface; and
a shielding encapsulation part connected to one of the interconnection parts, covering sidewalls of the dielectric layer, and including a portion that contacts the shielding plate,
wherein the interconnection parts include:
a ground interconnection part to which the shielding encapsulation part is connected; and
one or more signal interconnection parts being separated from the ground interconnection part and the shielding encapsulation part,
wherein the ground interconnection part includes:
a first ground contact portion electrically coupled to one of the through connectors;
a second ground contact portion corresponding to a portion of the shielding encapsulation part; and
a ground connection portion electrically coupling the first ground contact portion to the second ground contact portion, and
wherein the signal interconnection parts, the first and second ground contact portions, the ground connection portion, and the shielding encapsulation part are included in different regions of a single layer.

2. The semiconductor package of claim 1, wherein the shielding encapsulation part covers part of the first surface of the dielectric layer between the signal interconnection parts.

3. The semiconductor package of claim 1, wherein the shielding encapsulation part covers edge portions of the first surface of the dielectric layer.

4. The semiconductor package of claim 1, wherein a portion of the shielding encapsulation part contacts sidewalls of the shielding plate.

5. The semiconductor package of claim 1, wherein a portion of the shielding encapsulation part contacts top surfaces of edge portions of the shielding plate.

6. The semiconductor package of claim 1, wherein the shielding encapsulation part covers entire surfaces of sidewalls of the dielectric layer.

7. The semiconductor package of claim 1, wherein the through connectors include bumps penetrating the portion of the dielectric layer over the chip.

8. The semiconductor package of claim 1, further comprising one or more vertically stacked chips embedded in the dielectric layer and disposed between the chip and the shielding plate.

9. The semiconductor package of claim 8, wherein the chip and the stacked chips are vertically stacked to have a step structure.

10. The semiconductor package of claim 8, wherein the chip and the stacked chips are stacked and are vertically aligned with each other.

11. The semiconductor package of claim 8, further comprising inter-chip connectors electrically coupling the chip to the stacked chips.

12. The semiconductor package of claim 11, wherein the inter-chip connectors include any of wires and through electrodes.

* * * * *